United States Patent [19]

Eberwein et al.

[11] 4,024,502
[45] May 17, 1977

[54] DEVICE FOR REMOTE CONTROL OF ELECTRICAL POWER UNITS

[75] Inventors: Helmut Eberwein, Brendlorenzen; Alfred Vogt, Bad Neustadt-Herschfeld; Paul Greb, Heustreu, all of Germany

[73] Assignee: Preh Elektrofeinmechanische Werke, Jakob Preh Nachf., Bad Neustadt, Saale, Germany

[22] Filed: Oct. 23, 1975

[21] Appl. No.: 625,123

[30] Foreign Application Priority Data

Oct. 23, 1974 Germany .......................... 2450293

[52] U.S. Cl. ...................... 340/147 R; 340/171 PF; 340/171 A
[51] Int. Cl.² ......................................... H03K 5/20
[58] Field of Search ....... 340/171 R, 171 A, 147 R, 340/166 EL; 250/199, 548, 554; 307/111, 235, 278, 311; 315/134, 153, 154, 155

[56] References Cited

UNITED STATES PATENTS 3,885,231   5/1975   Gaddy .................... 340/166 EL

*Primary Examiner* — Harold I. Pitts
*Attorney, Agent, or Firm* — Cushman, Darby & Cushman

[57] ABSTRACT

An apparatus for remotely controlling one or more power units including a transmitter which produces an optical pulse train having a frequency varied by an astable multivibrator controlled by keys which connect different resistances into the astable circuit, and one or more receivers. Each receiver receives the optical pulses, converts them to electrical pulses, divides the frequency, counts the electrical pulses, provides an analog output from the counter and compares that analog output with a saw tooth periodic waveform to control circuit elements which in turn control conduction through the power unit.

15 Claims, 5 Drawing Figures

DEVICE FOR REMOTE CONTROL OF ELECTRICAL POWER UNITS

BACKGROUND OF THE INVENTION

The invention concerns an apparatus for remote control of electrical power units, which consists of a transmitter having an astable multivibrator and a receiver which transforms the light impulses into electrical impulses which are conducted as control signals to a continuous electronic recording circuit.

Wireless remote control devices have been in use for many years to remote control movable objects, as for example cranes, locomotives, model airplanes or toy automobiles. such devices are also used with entertainment devices, such as televisions, to control the same. Even with entertainment instruments, the various continually adjustable kinds of adjustments, as for example volume, brightness, and contrast, and the adjustments which take place in distinct stages, such as the special search action and the station selection, are even controlled by wireless remote control. In this type of device, an ultrasonic signal emitted from a transmitter is often used. This ultrasonic signal is converted in a receiver aerial into a control signal corresponding to the frequency selected. A special remote control channel is assigned to each kind of adjustment to be made, with the frequency belonging to it defining the type of adjustment value. In the case of the continually adjustable adjustments, usually two frequencies are chosen for values such as louder-softer, brighter-darker, etc. The amount of the desired change of the adjustment value is usually determined by different lengths of pressure on a key of the transmitter.

Various procedures for the ultrasonic remote control are known. In the case of the impulse-code-procedure, coded impulse sequences are radiated from the transmitter and decoded by the receiver. This procedure has the disadvantage that the sender and receiver are complex and expensive. Another already mentioned procedure provides that a frequency is assigned to each function. For recognition of the various frequencies, a number corresponding to the number of frequencies of resonating circuits is used. This technique, however, requires a time-consuming balancing process imperative before the putting into operation of the receiver.

One problem with using ultrasonic frequencies is that numerous extraneous noises, as for example rattling of keys, clapping of hands, the ringing of a telephone, etc., can cause malfunctions by varying ultrasonic wave components. There is the further disadvantage where several receivers are used in that a special frequency for each receiver must be provided, since reflected ultrasonics can still control receivers at substantial distances from the transmitter. Moreover, domestic animals whose range of hearing extends to the supersonic frequencies can be disturbed by ultrasonic signals.

SUMMARY OF THE INVENTION

The problem of the invention is to avoid the disadvantages enumerated in the case of optical remote control and to create a remote control, of which the circuit wiring expense is less and which can partly be manufactured in integrated technology. Further, several receivers with the same transmitter are to be switched off or on at every position of the adjustment value when the adjustment values can be changed continually. The remote control is not to be influenced by stray light.

The problem is solved according to this invention by providing in the transmitter an astable multivibrator which has several elements determining frequency which are present in pairs. For the duration of the activation of the respective type key these pairs are switched on, so that in this time an impulse series is produced with the same keying ratio. In the receiver, the electrical impulses, after the latter have passed through a selective filter circuit and a following signal converter circuit, are conducted over a frequency divider to a recorder, the outputs of which are connected with a 1 from $n$ decoder, on the outputs of which comparator circuit is connected, which compares the outputs of the decoder with the output of a time circuit during a periodically recurrent measurement time and in the case of the presence of an impulse of the same polarity on both outputs, transmits a control signal to the following control circuits of the electrical power unit.

Since the invention comprises the off and on switching as well as a continual adjustment of the electrical power unit, the invention can be used with power units which are merely switched on or off and/or with which a phasechannel circuit, null point regulation or the like is possible. Power units can for example be motor-driven in house installation, for room lamps, curtains, blinds or garage door control.

The advantages of this invention consist especially in that for example in the case of room lamps, the adjusted brightness does not change even over an extended period of time. Besides upon switching on the system voltage after system failure, the lamps are still in the off-position independent of their previous operational condition.

BRIEF DESCRIPTION OF THE DRAWINGS

Reference is now made to the figures in which.

DESCRIPTION OF THE PREFERRED EMBODIMENT

Figure 1:
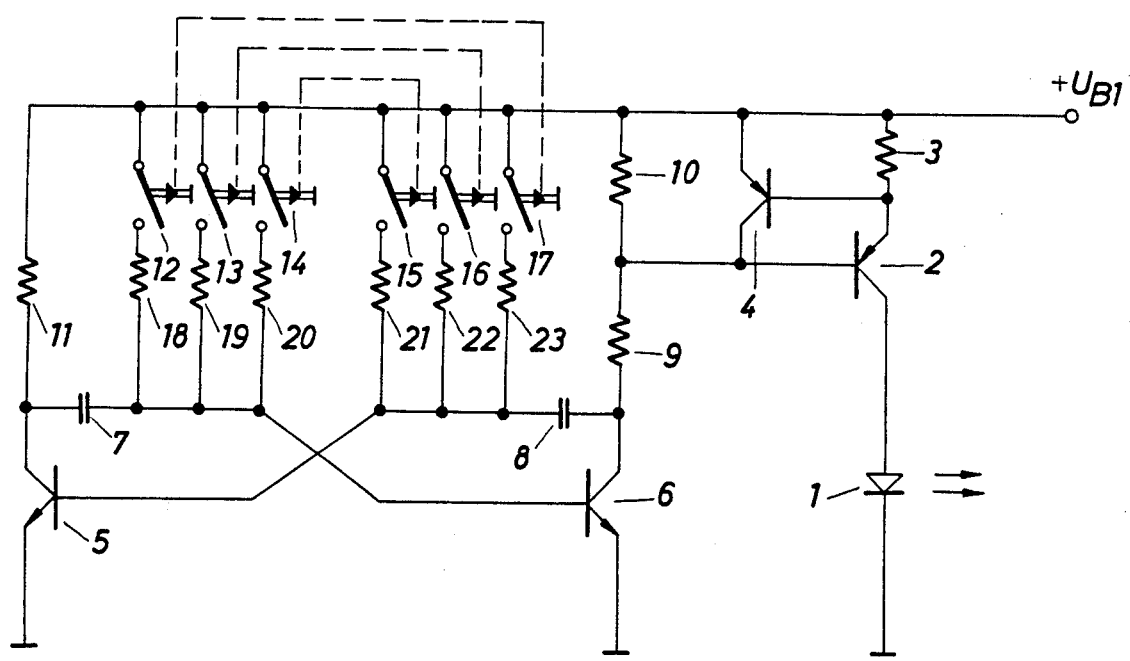
FIG. 1 shows a circuit diagram of a transmitter.

The transmitter circuit diagram shown in FIG. 1 indicates three frequency information channels, one of which switches the power unit on and off, and the other two of which change the adjustment value up or down. If necessary, the transmitter can have fewer or more information channels. The supply voltage $U_{B1}$ for the transmitter is preferably supplied from batteries, but alternatively, the transmitter can include a rectifying circuit for utilizing available AC power.

The transmitter produces light signals by means of a Ga-As-luminescence diode 1, which emits infrared light in the form of near monochromatic light with a wave length of 950 nm. The anode of diode 1 is connected to the collector of a transistor 2, the emitter of which is connected via resistor 3 to supply voltage $U_{B1}$. On the cathode side diode 1 is grounded. The base-emitter path of transistor 4 is connected in parallel with resistor 3, so that a constant current can flow through transistor 2 and diode 1, which can be calculated from the relationship of the base-emitter-voltage of the transistor 4 to the value of resistor 3. The current supplied to diode 1 is via the collector-emitter path of transistor 2, so that should the voltage supply $U_{B1}$ vary the current remains approximately constant through diode 1 to maintain the radiated power of the diode constant.

The circuit includes a conventional astable multivibrator, consisting of the transistors 5 and 6, capacitors 7 and 8 and fixed resistors 9, 10 and 11. The pair of resistors 20 and 21 or 19 and 22 or 18 and 23, respectively, are added to the circuit for the duration of activation of touch or sliding keys 12, 13, 14, 15, 16 and 17, so that the constant current is supplied to diode 1 with varying frequency as square pulses with a pulse-pause ratio of 1:1. A frequency range between 19 to 38 KHz is usually selected for transmission.

Figure 2:
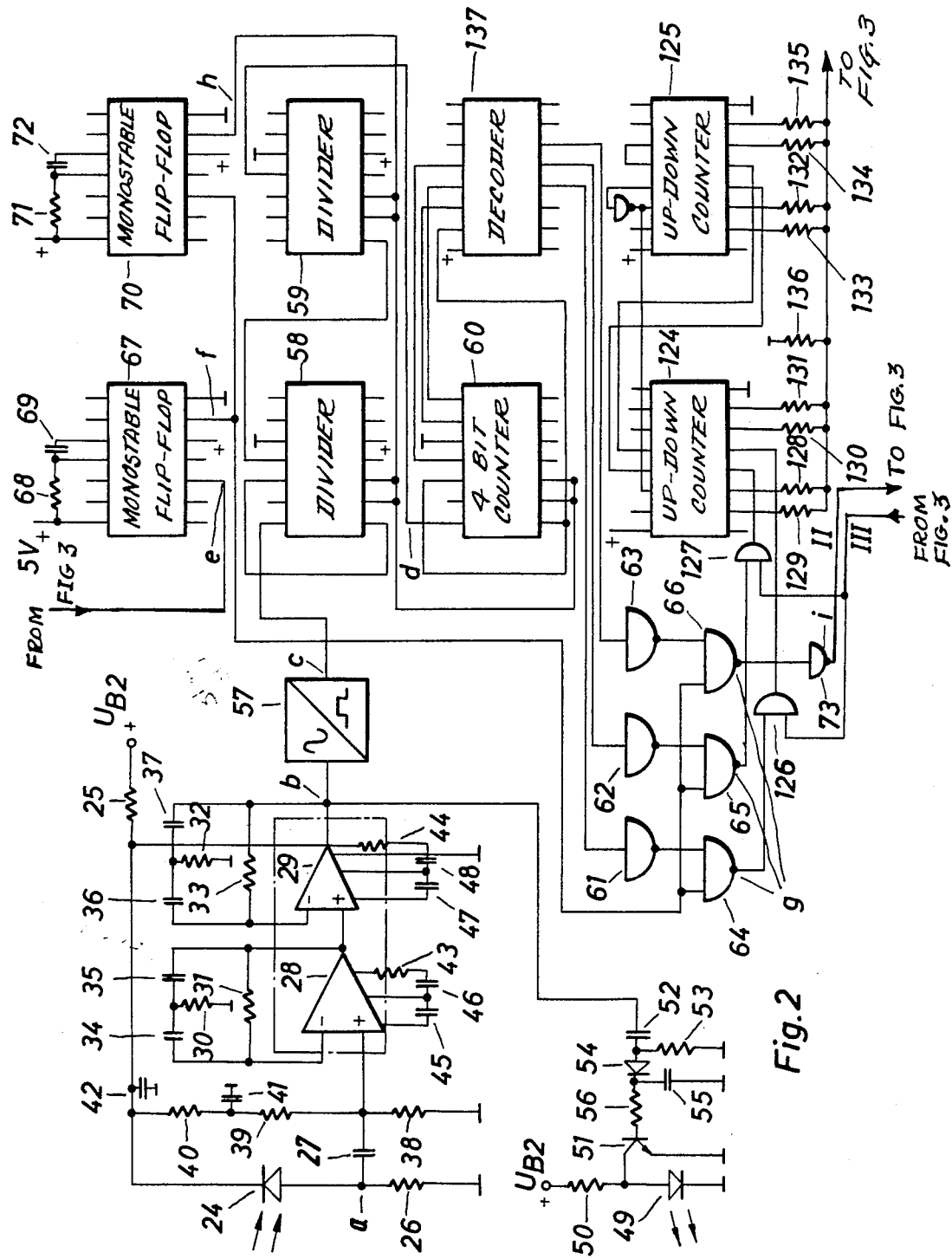
FIG. 2 shows a circuit diagram of a part of a receiver.

To transform the transmitted infrared light signals into electrical signals, preferably a photodiode 24 is operated in a high resistance circuit with a large light leak angle in FIG. 2. The cathode of diode 24 is connected via resistor 25 to supply voltage $U_{B2}$ and to ground via resistor 26. On the anode side, the signal voltage is coupled via condensor 27 to the positive input of operational amplifier 28. Operational amplifiers 28 and 29 are connected in series and function as band pass filters with the resistors 30, 31 as well as 32, 33 and the condensors 34, 35 and 36 having values such that the two outer band limits are roughly 19 and 38 kHz. Since for the operation of the filter only a positive supply voltage $U_{B2}$ is available, the negative input is grounded. The positive input of the operational amplifier 28 is connected to $U_{B2}$ via the voltage divider formed by resistors 38, 39 and 40. Resistor 40 and condensors 41 and 42 serve as ground for the supply voltage. Resistors 43, 44 and the condensors 45, 46, 49, 50, 47 and 48, suppress oscillation of operational amplifiers 28 and 29.

In direct proximity to the photodiode 24 a light source emitting a visible light is mounted, which preferably is a light diode 49. This light diode is connected to $U_{B2}$ via a resistance 50 and lights continually, as long as transistor 51 is kept non-conductive. If now a signal is received by the photodiode 24, then the increased signal b from the output of operational amplifier 29 is applied via the direct voltage grounding condensor 52 with band resistance 53 to a rectifying circuit consisting of a diode 54 and a condensor 55 and from there via resistor 56 to the base of transistor 51, which short circuits the diode 49 so that it goes out only for the duration of the transmission.

The alternating-current voltage b at the output of the operational amplifier 29 is shaped by conventional circuit 57 and transformed into noiseless square wave impulses c with steep flanks.

Figure 4:
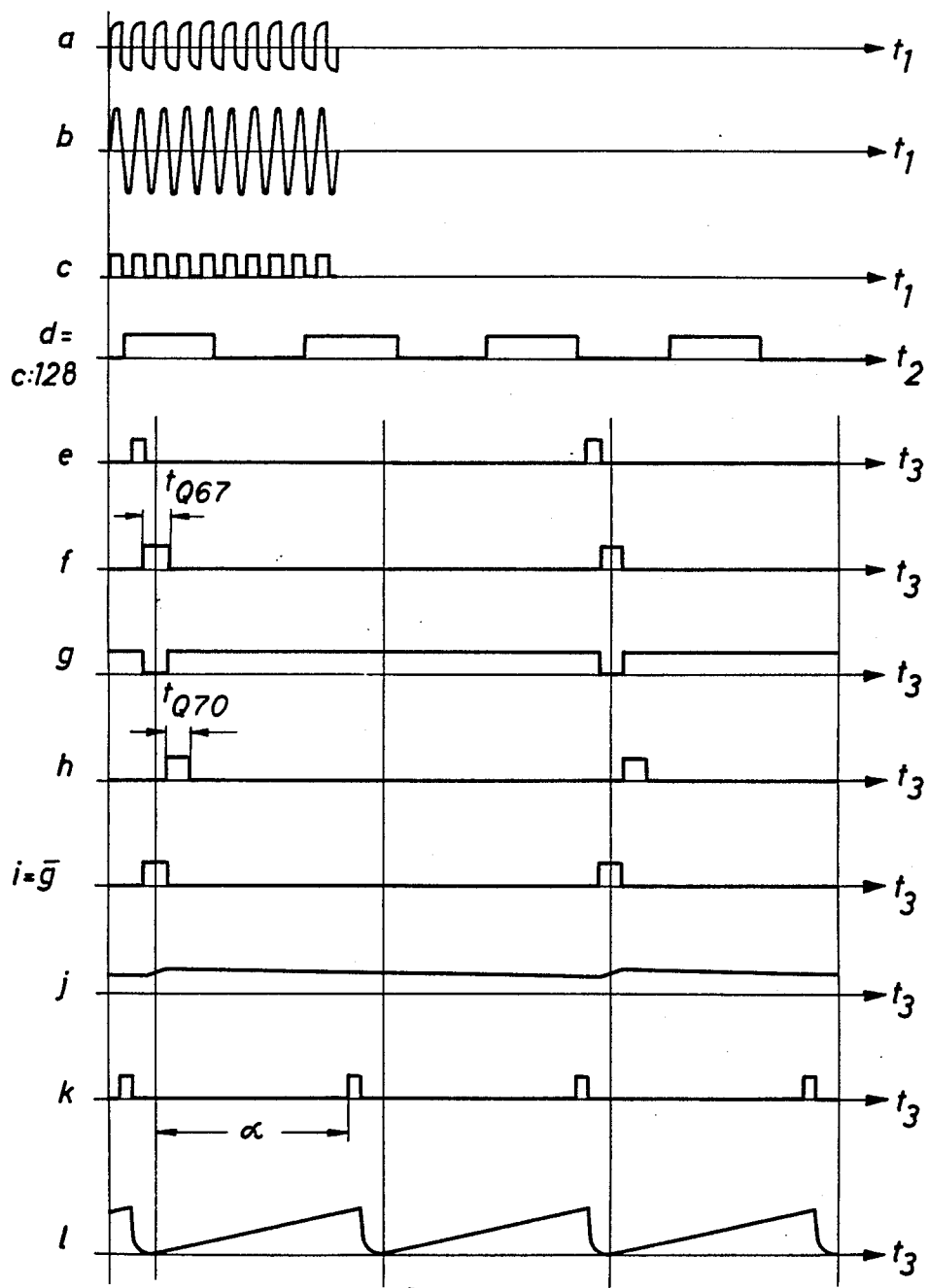
FIGS. 4 and 5 show a waveform chart.
Figure 5:
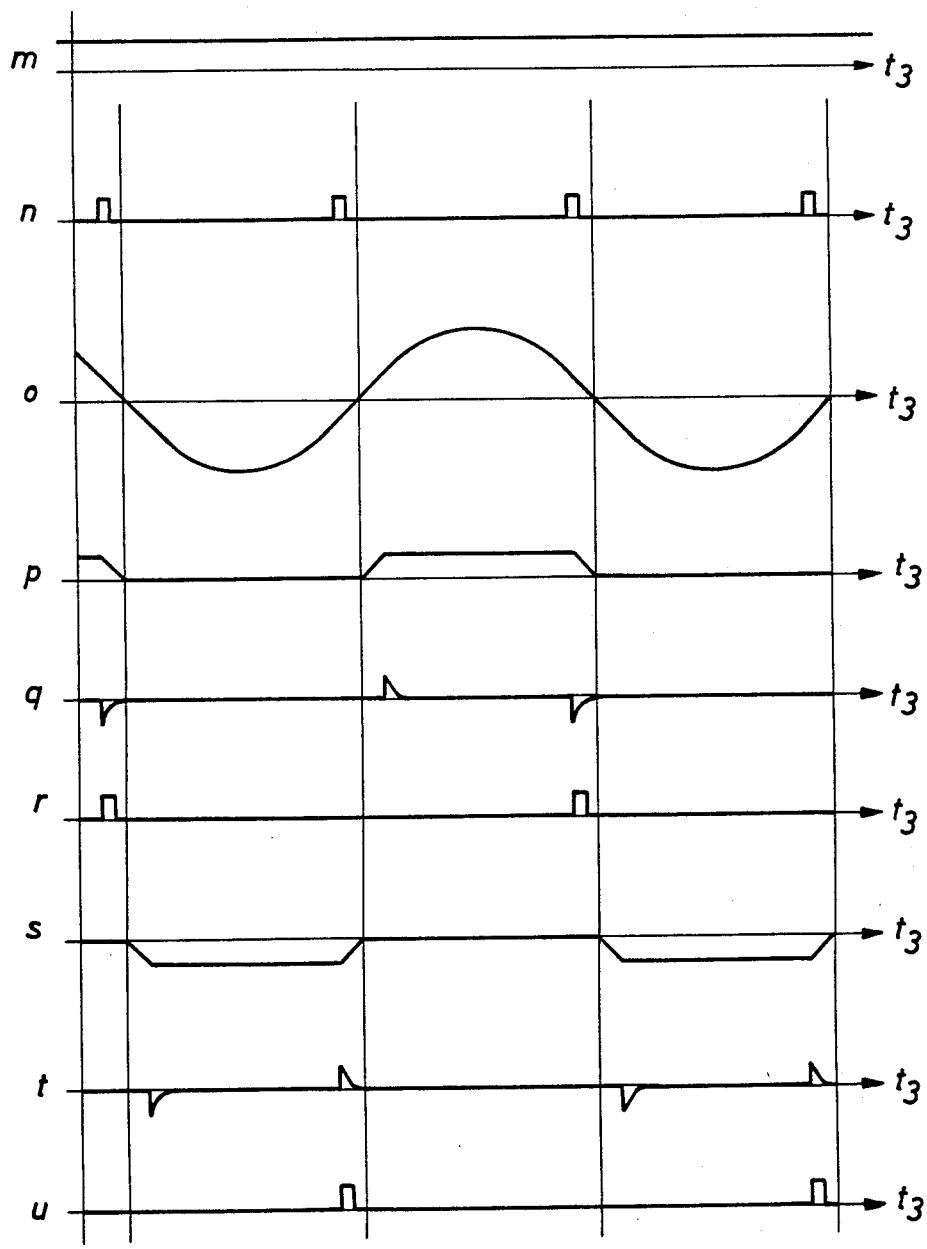

The recording circuit consists of conventional 16 impulse dividers 58 and 59, which divide down the transmitted impulses in the ratio 1:128. The 4-bit binary counter 60 counts the subdivided impulses only during a measuring interval of 20 ms which interval is repeated. In the 1 from n decoder 137 the binary output of counter 60 is decoded. The decimal output signals of decoder 137 are inverted by inverters 61, 62 and 63 and connected respectively with an input to NAND-gates 64, 65 and 66. The input of the monostable flip-flop 67 is a system-synchronized impulse e, as shown in FIG. 4, with a 20 ms repeat duration. The output impulse f of monostable flip-flop 67 with pulse duration $t_{q67} = R_{68} \cdot C_{67} \cdot C_7$ is applied to the other inputs of each of NAND-gates 64, 65 and 66. If a low-signal is produced at one of the decimal outlets of decoder 137 during the pulse duration $t_{q67}$ of the flip-flop 67, and consequently a high signal at the inverter outlet, then the corresponding output of the NAND-gate switches to low during the duration of the pulse. As long as the same frequency is transmitted, a pulse train g with 20 ms repeating duration is provided at the outlet of the respective NAND gate associated with that frequency. With output impulses f of flip-flop 67 a further flip-flop 70 is controlled, of which the output impulses h are delayed by the time $t_{q70} = R_{71} \cdot C_{72} \cdot 0,7$. The outlet impulses h reset divders 58 and 59, as well as the counter 60, after the outputs of the decoder 137 have been interrogated with the outlet signal f of flip-flop 67.

The transmission frequencies have been selected in such a way that the 4-bit-binary counter 60 in 20 ms counts to 3, 4 or 5. After 128 impulses at the input of the divider 58 the counter 60 counts one more. Consequently, the following table results:

| Counter-position Z | Number of the impulses every 20 ms | Duration of the periods t every impulse n t = 20/n μs | Frequency f = 1/t kHz |
|---|---|---|---|
| 1 | 128 – 255 | 156,25 – 78,43 | 6,4 – 13,75 |
| 2 | 256 – 383 | 78,125 – 52,219 | 12,8 – 19,15 |
| 3 | 384 – 511 | 52,083 – 39,138 | 19,3 – 25,55 |
| 4 | 512 – 639 | 39,062 – 31,29 | 25,6 – 31,95 |
| 5 | 640 – 767 | 31,25 – 26,075 | 32,0 – 38,34 |

Figure 3:
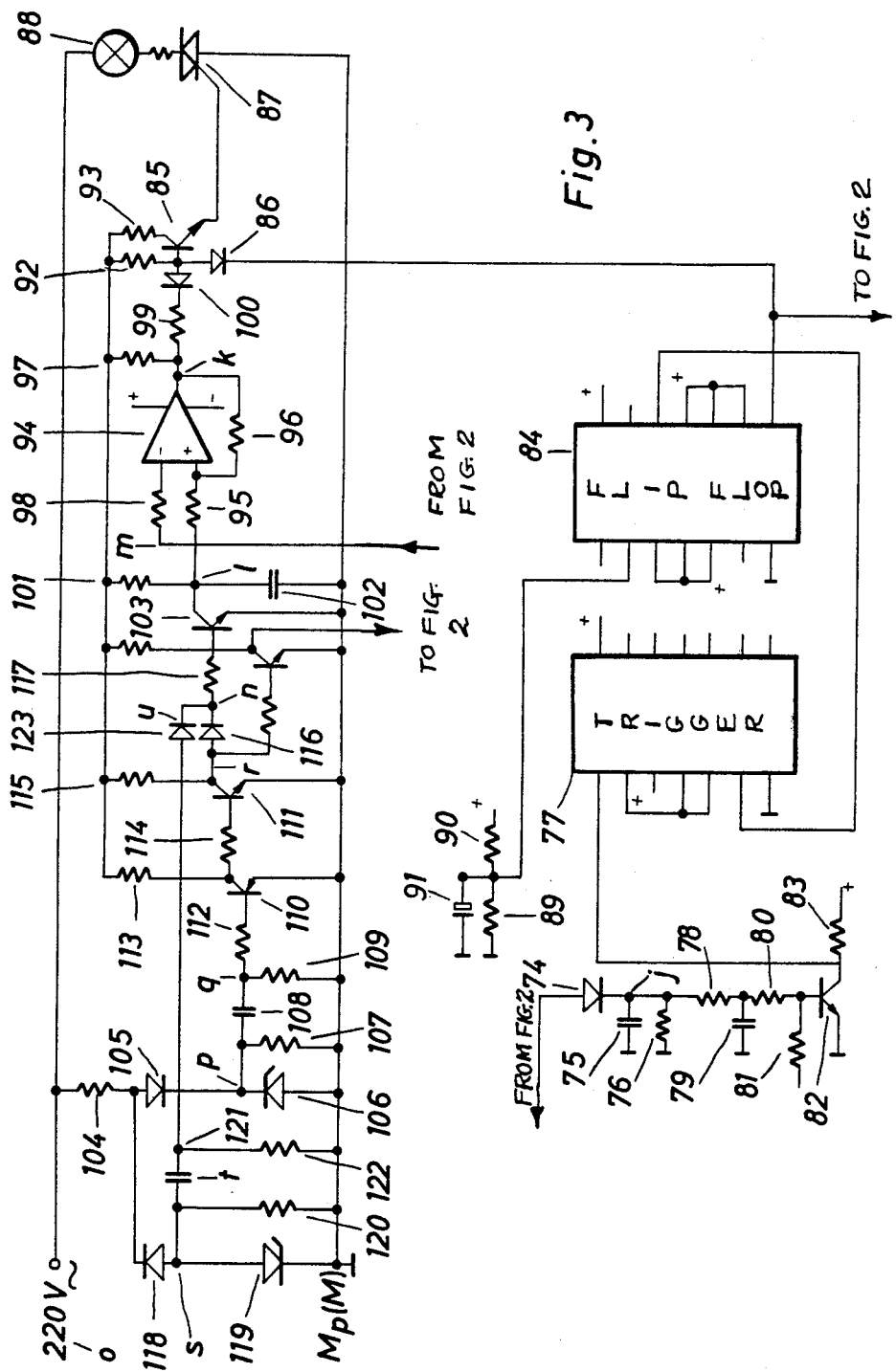
FIG. 3 shows a circuit diagram of the other part of the receiver.

The transmission frequencies are consequently
$f_1 = 22,375 \pm 3,175$ kHz
$f_2 = 28,775 \pm 3,175$ kHz
$f_3$ 35,17 $\pm$ 3,175 kHz The output signal g of the NAND-gate 66 is inverted by inverter 73 (FIG. 2) and rectified by diode 74 (FIG. 3). Trigger 77 circuit is supplied slowly by the delay circuit comprising elements 78, 79, 80, 81 and 82, 83. The output signal of the trigger circuit 77 switches a masterslave flip-flop 84, the output signal of which changes with every renewed trigger from high to low or low to high. On the low-signal from flip-flop 84 the base of the circuit transistor 85 is connected via diode 86 through the internal circuit of flip-flop 84 with ground. Consequently, transistor 85 is non-conductive, so that triac 87 is not controlled and the power unit 88 remains switched off. With renewed transmission signal the output of flip-flop 84 is switched to high, so that by means of the circuit transistor 85 and of triac 87 the power unit is switched on.

The circuit consisting of the resistors 89 and 90 and the condensor 91, ensures that on return of the supply voltage — for example after a system breakdown — the low signal is produced briefly on the reset input of flip-flop 84, so that the output is switched low and consequently the power unit 88 remains switched off.

For control of the triac 87, a circuit transistor 85 is used. Resistors 92 and 93 connect operational amplifier 94 as a comparator which, with the wiring resistors 95, 96, 97 and 98, produce control impulses k to be applied to transistor 85 via base resistor 99 and diode 100. Signals k can be displaced synchronized by power supply with a direct voltage with a phase angle x between 0° and 180° and 180° and 360°. The displacement of the control impulses takes place in such a way that, at positive input of the operational amplifier 94 is applied a saw-toothed voltage 1 synchronized by the power supply with a frequency of 100 Hz. A variable reference voltage m is applied to the positive input so that the output of comparator 94 then switches to the high signal, when the value of the saw-tooth voltage 1 is the same as variable reference voltage m. The saw tooth voltage 1 is applied via a load resistor 101 and condensor 102. The discharge of the condensor 102 takes place at low resistance over the collector-emitter portion of the transistor 103 in synchronism with the system voltage. For production of the system synchronized control impulses n for transistor 103, the positive half-waves of diode 105 with the breakdown diode are limited as waveform p by the system voltage o over a resistor 104. Signal q is formed by differentiating elements 107, 108 and 109 from which the negative pulses r switch through transistor 13 in a reversal stage, consisting of the transistors 110 and 111 and the resistors 112, 113, 114, 115 over the diode 116 and base resistor 117. For the rest negative half-waves are rectified by diode 118 with the breakdown diode 119 and formed over a differentiating element 120, 121 and 122 into impulses t, from which the positive pulses u likewise connect through the transistor 103, so that the transistor unloads all 10 ms before the null passage of the system voltage to the condensor 102.

The reference voltage m is shifted by phase angle x by means of two consecutively-connected 4-bit, reversing counters 124 and 125.

For brightness control of the power unit 88 the reference voltage m for comparator 94 must become smaller, so that the increasing saw tooth voltage 1 will switch the comparator at the smaller phase angle x and the triac 87 consequently is fired earlier; for darker adjustment the reference voltage m must become greater.

The outlet of the NAND-gate 64 is connected via gate 126 to the forward count input and that of the NAND-gate 65 via gate 127 to the reversing count input of the updown counter 124. If now for example a transmitted signal is sent with the frequency for darkness control, then at the outlet of the NAND-gate 64 a pulse sequence g with 20 ms for the duration of the signal appears, so that the counter 124 counts for 20 ms periods. Using both 8-bit counters up to 255 can be counted, so that a control time of 20 ms × 255 = 5.1 seconds results for darkness regulation and 5.1 seconds for brightness regulation.

The binary outputs with the value $W = 1, 2, 4, 8, 16, 32, 64$ and $128$ are wired with resistors, whereby at the outlet with $W = 1$, a resistance with the resistance value $R = 1$ and at the outlets $W = 2$ $R = \frac{1}{2}$, $W = 4$ $R = \frac{1}{4}$, $W = 8$ $R = \frac{1}{8}$, etc, is required. The resistors 128 to 135 are grounded together via a resistor. At the intersection now stands a reference voltage m, which varies according to each counter position between about 0V and for example +2V. On the basis of the 255 counter steps for the regulation during 5.1 seconds, a delicate, continuous regulation is possible.

The two input of the NAND-gates 126 and 127 are connected with the output of master-slave-flip-flop 84. Thereby it is ensured that only when the outlet has the high signal, and thus the power unit 88 is switched on, a bright-darker-regulation is possible.

The wiring is constructed in this form of construction from single elements and integrated circuits. However, several separate elements and/or integrated circuits can, if desired, be combined in a single integrated circuit.

What is claimed is:

1. An apparatus for remote control of an electrical appliance, consisting of a transmitter for producing an optical signal and a receiver for controlling an electronic control circuit of said electric appliance in response to the optical signal, the transmitter comprising a number of keys and a multivibrator including an equal number of pairs of control elements selectively actuable by said keys to determine the frequency of said optical signal, and the receiver comprising a photo-electric element for transforming the optical signal into electrical pulses, a band pass filter connected to said photo-electric element for filtering said electrical pulses, means connected to said filter for shaping said electrical pulses, a frequency divider circuit connected to said shaping means for producing one pulse for each given number of said electrical pulses, a counter circuit connected to said divider circuit for producing an output signal indicating the number of pulses produced by said divider circuit in a given time and hence the frequency of said optical signal, a 1-out-of-n decoder connected to the output of said counter circuit for producing a decoded signal indicating said frequency, a timer circuit connected to said counter circuit for producing a periodic timer signal for resetting said counter circuit at the end of said given time, and means for comparing the output of said decoder with the output of said timer circuit and producing a control signal applied to said electronic control circuit.

2. An apparatus as in claim 1, wherein said comparing means includes control means comprising an up-down counter, logic means connected to said decoder and connecting said timer circuit to the respective up and down inputs to said up-down counter for causing said up-down counter to be incremented in response to said timer signals when said decoder indicates a first frequency and to be decremented in response to said timer signals when said decoder indicates a second frequency, and a digital to analog converter connected to the output of said up-down counter for producing an analog signal indicating the count in said up-down counter.

3. An apparatus as in claim 2, wherein said control means further includes an operational amplifier functioning as a comparator, a resistor connecting said operational amplifier output to one input to said operational amplifier, means for generating a reference signal upon production of each timer signal, which reference signal increases, means for applying said reference signal and said analog signal to said operational amplifier, and means for controlling said appliance in accordance with the comparison.

4. An apparatus as in claim 3, wherein said control means further includes a triac serially connected with said appliance, a switching transistor connected to said triac for causing said triac to be conductive and non-conductive, and a serially connected resistor and diode connecting the output of said operational amplifier to the base of said switching transistor.

5. An apparatus as in claim 4, wherein said control means includes logic means connected to said decoder for producing an on-off signal when said decoder indicates a third frequency, means for rectifying said on-off signal, a time lag circuit for delaying the rectified on-off signal, a Schmitt trigger circuit responsive to the rectified and delayed signal, a masterslave flip-flop responsive to the output of said Schmitt trigger circuit, and a diode connecting the output of said flip-flop to the base of said switching transistor for preventing operation of said appliance until said on-off signal has been produced.

6. An apparatus as in claim 5, wherein said digital to analog converter includes a plurality of resistors of different values each connected between an output of said up-down counter and a common point and a resistor connecting said common point to ground.

7. An apparatus as in claim 5, wherein said flip-flop has a reset input and including first and second resistors connected between a given voltage and ground to form a voltage divider, a capacitor connected between the common connection of said resistors and ground and means connecting said common connection to said reset input.

8. An apparatus as in claim 5, wherein said timer circuit includes a first monostable flip-flop for producing pulses synchronized with the power supply at 20 ms period and a second monostable flip-flop connected to the output of said first flip-flop for producing pulses resetting said frequency divider circuit and said counter circuit.

9. An apparatus as in claim 8 including a NAND gate connecting said logic means to enabling inputs of said up-down counter and connected to the output of said master-slave flip-flop for preventing counting when the appliance is turned off.

10. An apparatus as in claim 1, wherein said comparing means includes control means for controlling said appliance in accordance with said control signal including a triac for controlling the appliance, a transistor connected to said triac for controlling conduction of current through said triac, a comparator circuit, means for generating a power source synchronized saw-toothed voltage with a repeat period of 10 ms, means for connecting said saw-toothed voltage to said comparator and for producing a control signal from said decoded signal and applying said control signal to said comparator circuit.

11. An apparatus as in claim 10, wherein said saw-toothed voltage producing means includes a capacitor grounded at one end, a resistor for connecting the other end of said capacitor to a supply voltage, a transistor connected to said capacitor, and means for supplying a pulse train at a frequency of 10 ms to the base of said transistor for producing said saw-toothed waveform.

12. An apparatus as in claim 11, wherein said pulse train producing means includes means for applying a sinusoidal voltage to the serial connection of a diode and a break-down diode, means for differentiating the signal produced at the point of a connection between diodes, and means for the applying of differentiated signals to said capacitor.

13. An apparatus as in claim 1, wherein said receiver includes a source of light and means for causing said source to be illuminated except when said appliance is controlled.

14. An apparatus as in claim 13, wherein said light source is a light diode and wherein said causing means includes means for connecting the cathode of said light diode to ground, a resistor connecting the anode of said light diode to a supply voltage, a transistor having its collector connected to said anode, a capacitor connected to the base of said transistor, and rectifying means connecting said base and capacitor to the output of said filter circuit.

15. An apparatus as in claim 1, including a rechargeable battery for supplying current to the circuits.

* * * * *